(12) United States Patent
Muller et al.

(10) Patent No.: US 8,203,182 B2
(45) Date of Patent: Jun. 19, 2012

(54) FINFET WITH TWO INDEPENDENT GATES AND METHOD FOR FABRICATING THE SAME

(75) Inventors: Markus Gerhard Andreas Muller, Grenoble (FR); Philippe Coronel, Barraux (FR)

(73) Assignees: NXP B.V., Eindhoven (NL); ST Microelectronics (Crolles 2) SAS, Crolles (FR)

( * ) Notice: Subject to any disclaimer, the term of this patent is extended or adjusted under 35 U.S.C. 154(b) by 87 days.

(21) Appl. No.: 12/529,640

(22) PCT Filed: Mar. 6, 2008

(86) PCT No.: PCT/EP2008/052731
§ 371 (c)(1), (2), (4) Date: Sep. 2, 2009

(87) PCT Pub. No.: WO2008/110497
PCT Pub. Date: Sep. 18, 2008

(65) Prior Publication Data
US 2010/0102389 A1    Apr. 29, 2010

(30) Foreign Application Priority Data

Mar. 14, 2007 (EP) .................................. 07290318

(51) Int. Cl.
*H01L 29/78* (2006.01)
(52) U.S. Cl. ............... 257/347; 257/368; 257/E27.005; 257/E29.264; 438/157; 438/163
(58) Field of Classification Search .................. 257/347, 257/368, E21.415, E27.005, E29.264, E21.421; 438/157, 163, 164
See application file for complete search history.

(56) References Cited

U.S. PATENT DOCUMENTS 6,458,662 B1    10/2002 Yu
(Continued)

FOREIGN PATENT DOCUMENTS

EP    1727194 A1    11/2006
(Continued)

OTHER PUBLICATIONS

International Search Report; PCT/EP2008/052731; Nov. 6, 2008.
(Continued)

*Primary Examiner* — Minhloan T Tran
*Assistant Examiner* — Fazli Erdem

(57) ABSTRACT

A FinFET (100) comprises a fin-shaped layer-section (116) of a single-crystalline active semiconductor layer (104) extending on an insulating substrate layer (106) along a longitudinal fin direction between, a source layer-section (122), and a drain layer-section (124) of the single-crystalline active semiconductor layer (104). Furthermore, two separate gate-electrode layers (138.1, 138.2) are provided, which do not form sections of the single-crystalline active semiconductor layer, each of the gate-electrode layers facing one of the opposite side faces of the fin-shaped layer-section (116). Each gate-electrode layer is connected with a respective separate gate contact (154, 156). The gate-electrode layers, as seen in a cross-sectional view of a plane that is perpendicular to the longitudinal fin-direction, are arranged on the substrate layer (106) between the respective side face of the fin-shaped layer section and a respective contact-post layer section (118, 120) of the single-crystalline semiconductor layer (104).

11 Claims, 11 Drawing Sheets

U.S. PATENT DOCUMENTS

| | | |
|---|---|---|
| 6,853,020 B1 | 2/2005 | Yu et al. |
| 2002/0011612 A1* | 1/2002 | Hieda .......................... 257/262 |
| 2004/0235300 A1* | 11/2004 | Mathew et al. ............... 438/689 |
| 2005/0040444 A1 | 2/2005 | Cohen |
| 2005/0056845 A1 | 3/2005 | Achuthan et al. |
| 2005/0124120 A1 | 6/2005 | Du et al. |
| 2005/0148190 A1* | 7/2005 | Dubin et al. ................. 438/700 |
| 2006/0275988 A1 | 12/2006 | Yagishita et al. |
| 2007/0278578 A1* | 12/2007 | Yoshida et al. ............... 257/347 |
| 2009/0209092 A1* | 8/2009 | Sonsky et al. ................ 438/479 |

FOREIGN PATENT DOCUMENTS

| | | |
|---|---|---|
| JP | 2003229575 A | 8/2003 |
| WO | 2005091374 A1 | 9/2005 |
| WO | 2006087798 A1 | 8/2006 |
| WO | 2008007331 A2 | 1/2008 |

OTHER PUBLICATIONS

Written Opinion of the International Searching Authority; PCT/EP2008/052731; Nov. 6, 2008.

* cited by examiner

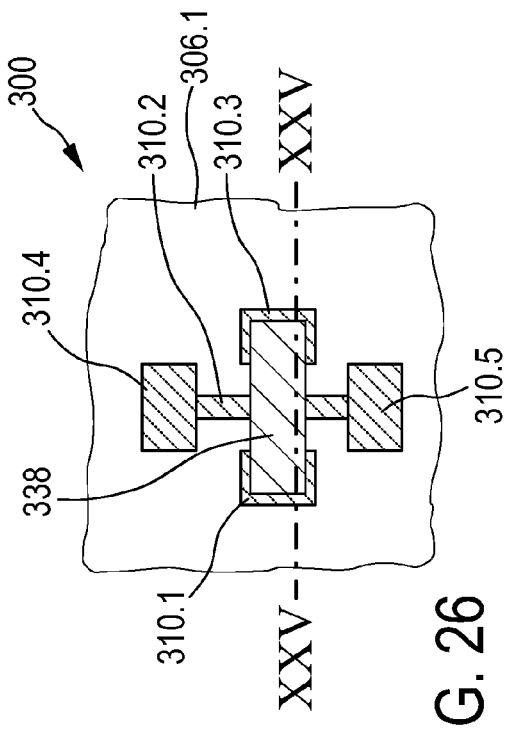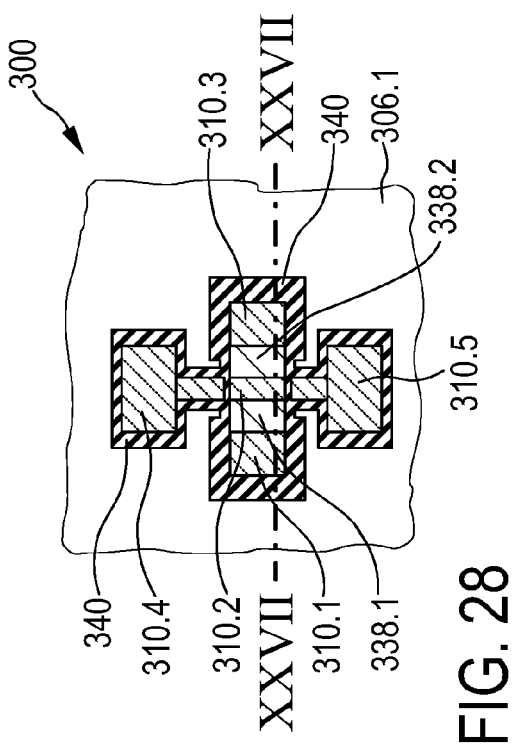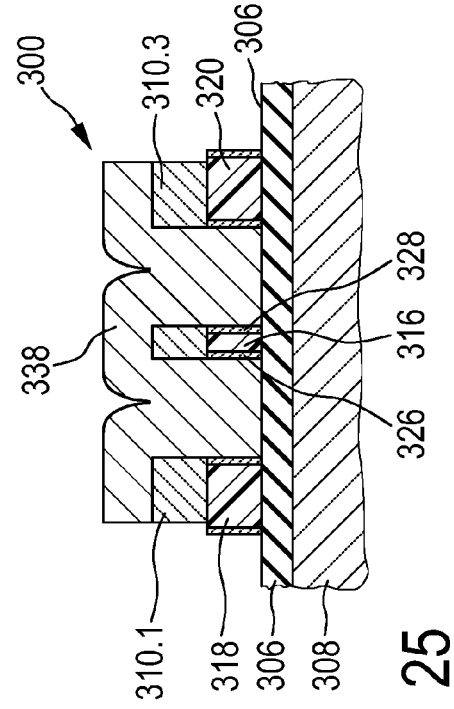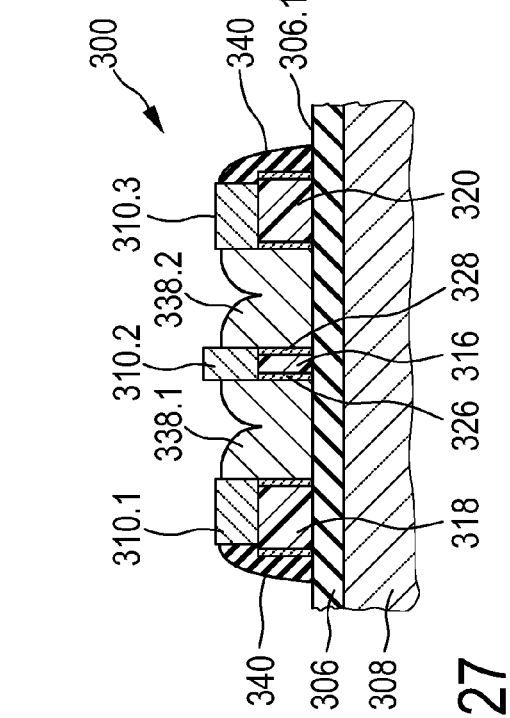

FINFET WITH TWO INDEPENDENT GATES AND METHOD FOR FABRICATING THE SAME

FIELD OF THE INVENTION

The present invention relates to Fin field effect transistor, hereinafter FinFET, to a FinFET arrangement comprising a plurality of FinFETs and to a method for fabricating a FinFET.

BACKGROUND OF THE INVENTION

FinFET devices are promising candidates for future technology nodes of silicon device technologies such as complementary metal-oxide-semiconductor (CMOS), because they offer a very good channel control via the gate electrode. In some known devices the gate electrode is wrapped around a conducting fin-shaped semiconductor layer, allowing a volume control of the conducting channel in the fin-shaped semiconductor layer. Moreover, FinFETs can easily be fabricated starting from a semiconductor on insulator (SOI) substrate.

Two independently addressable gate electrodes are a very interesting option to achieve an ultimate threshold adjustment, e.g., for applications profiting from multiple threshold voltages $V_t$. Another advantage of independently addressable gate electrodes is that a shift of the gate work function can be compensated, which opens a wide choice of gate materials. The separation of the gate electrode into two independent gate electrodes on each side of the fin is feasible by deposition of a dielectric layer and a subsequent chemical-mechanical polishing (CMP) step, by or by a self-planarising deposition (spin-on techniques) with an isotropic etch back, as described in US 2005/0124120 A1. However, both CMP and self-planarising deposition solutions are difficult to use in the front end processing, i.e., in the fabrication of the transistor structures on a wafer. For the result of these steps depends strongly on the device density and thus on the layout of the circuits to be fabricated on the respective wafer. This reduces the device yield and affects the performance and reliability of circuits containing such FinFET structures.

SUMMARY OF THE INVENTION

It is desirable to provide a FinFET with independently addressable gate electrodes, which allows fabricating reliable circuits independent of the circuit layout.

According to a first aspect of the invention, FinFET is provided, which comprises:
  a fin-shaped layer-section of a single-crystalline active semiconductor layer extending on an insulating substrate layer along a longitudinal fin direction between a source layer-section and a drain layer-section of the single-crystalline active semiconductor layer,
  gate insulation layers arranged on two opposite side faces of the fin-shaped layer-section, and
  two separate gate-electrode layers, which do not form sections of the single-crystalline active semiconductor layer, each of the gate electrode layers facing one of the opposite side faces of the fin-shaped layer-section, and each gate electrode layer being connected with a respective separate gate contact.

In the FinFET of the first aspect of the invention, each of the gate-electrode layers, as seen in a cross-sectional view of a plane that is perpendicular to the longitudinal fin-direction, is arranged on the substrate layer between the respective side face of the fin-shaped layer section and a respective contact-post layer section of the single-crystalline semiconductor layer.

The FinFET structure of the invention enables a fabrication of FinFETs with separate or, in other words, independent gate electrode-layers without employing any CMP, a self-planarising layer deposition or additional photolithography.

Techniques using a supplementary photolithography step for fabricating would be cost-intensive in manufacturing and limited by alignment problems when going to deeply scaled devices. In contrast, the FinFET structure of the invention has the advantage of being scalable without incurring additional process complexity or cost. That means, the FinFET of the invention is particularly suited for present and coming technology nodes with channel lengths in the range at and below 65 nm. However, the FinFET of the invention is not limited in its applicability to such technology nodes.

A contact-post layer section of the active semiconductor layer is a layer section of the active semiconductor layer that functions as a post for a gate contact. In other words, the contact-post layer section of the active semiconductor layer forms a foundation or a pedestal, on which at least a portion of a gate contact is arranged. A bottom face of the gate contact thus faces the contact-post layer section at least in part. The contact-post layer section will hereinafter also be referred to in short as the contact post.

The function or technical effect of the contact-post layer section is not restricted to that of a post. Notably, the presence of the contact-post layer sections allow fabricating proper gate contacts next to the fin-shaped layer section of the active semiconductor layer. The contact-post layer section may also contribute to the electrical function of the gate contact, i.e., assist in applying a gate voltage to the respective gate-electrode layer during operation of the FinFET. Additional advantageous effects and functions of the contact-post layer section will become apparent from the description of embodiments of the FinFET of the invention further below and from the later description of the method aspect of the invention.

The FinFET of the invention has a single-crystalline active semiconductor layer extending on an insulating substrate that is patterned to not only form source, drain and fin-shaped layer sections, but to additionally form contact-post layer sections. The term "layer section" used for the fin-shaped, the source, drain, and contact-post layer sections thus refers to the fact that the source and drain of the FinFET form functionally separate sections of a single original layer, namely, the active semiconductor layer, which is patterned into functionally separate layer sections in the FinFET device structure. This will be fully appreciated in view of the later description of the method aspects of the invention.

The single-crystalline active semiconductor layer of the invention is designated as "active" for the purpose of indicating that electrically active transistor structures of source, drain and fin-shaped channel region are formed from this layer. Of course, other layers of the FinFET also contain structural elements, which are electrically active during transistor operation. For instance, the two gate-electrode layers do not form sections of the single-crystalline active semiconductor layer, even though they are active during transistor operation. For the person skilled in the art it is possible to distinguish between the single-crystalline active semiconductor layer and other layers such as the gate-electrode layers by conventional analytic techniques such as transmission or scanning-electron microscopy of a cross sectional plane of the FinFET. Different crystal structures, material compositions or layer appearances can be analyzed and visualized by, for example, different electron-microscopic techniques. This way, clear indicators for whether a structural element of an analyzed FinFET forms a layer section of the active semiconductor layer or not can be obtained.

When speaking of a layer that is arranged on the substrate layer, this means, in particular, an arrangement of the layer in abutment to the substrate layer. With respect to the gate-electrode layers this means, in other words, that the gate electrode layers have their bottom faces forming an interface directly with the substrate layer. One respective side face of the gate electrode layers forms an interface with the respective gate insulation layers arranged on a respective side of the fin-shaped layer section.

In the following, embodiments of the FinFET of the first aspect of the invention will be described. The embodiments can be combined with each other, unless explicitly described as forming alternatives to each other.

In one embodiment, the gate contacts of the FinFET are arranged on a top face of the respective contact-post layer section of the active semiconductor layer and abutting a side face of the respective gate-electrode layer. In this embodiment, an electrical contact between the gate-electrode layer and the respective gate contact is provided via their side faces.

Additional contact area between the gate contact and the gate-electrode layer can advantageously be provided by the top surface of the respective contact-post layer section. In one embodiment, the gate contacts therefore are arranged abutting a top face of the respective gate-electrode layer. For the purpose of definition, the top face of the contact post is arranged opposite to a bottom face, which interfaces with the substrate layer. If the additional contact area should not be desired, the top surfaces of the contact posts can be covered with an insulation layer.

Even further contact area is achieved by providing gate contacts, which have the shape of an L turned upside down, the vertical bar of the L extending perpendicularly to the substrate layer from the contact-post layer section to increasing distances from the substrate layer, the horizontal bar of the L being arranged on the respective gate-electrode layer. This shape also can also be described by the Greek capital letter Gamma, or "Γ", and may also be present in a form mirrored along an axis parallel to the vertical bar of the Gamma, to take the shape of a mirrored Gamma or "⌐". The actual shape depends on the lateral side of the FinFET, on which the gate contact is arranged. On both sides, the gate-contact portion corresponding to the horizontal bar extends from its contact point with the gate-contact section corresponding to the vertical bar towards the fin-shaped layer section.

In a further embodiment, the fin-shaped layer-section and the contact-post layer sections of the single-crystalline semiconductor layer on the substrate layer have an equal thickness. The thickness corresponds to the height of the fin above the substrate layer. In some embodiments, it amounts to 60 to 80 nanometers. Preferably, also the source and drain layer sections have a thickness equal to the fin-shaped layer-section of the single-crystalline semiconductor layer. This feature is a characteristic indication of a processing according to embodiments of the method of the invention.

In a further embodiment, a lateral distance between the fin-shaped layer section and a respective contact-post layer section of the single-crystalline semiconductor layer is smaller than 2 times the thickness of the gate-electrode layer, which is the height of this layer measured from the surface 106.1 of the underlying insulating layer 106. This gives a large freedom for the scalability of the device. Preferably, the ratio between these distance and height values is even less than 1.5. The minimum distance between the fin-shaped layer section and a respective contact-post is determined by the limitations of electron beam lithography and is of the order of 30 nm.

A second aspect of the invention is formed by a FinFET arrangement containing a plurality of neighboring FinFETs according to the first aspect of the invention, or one of the embodiments of the FinFET described herein, wherein two neighboring FinFETs share one gate electrode layer, one contact-post layer section and one gate contact. In this FinFET arrangement, the contact post is for the gate contacts to both neighboring gates.

The advantages of the FinFET arrangement correspond to those of the FinFET of the first aspect of the invention.

Instead of a "Gamma" shape, the gate contact of the FinFET arrangement preferably has a T-shape. The two wings of the horizontal T-bar of the gate contact are arranged on gate-electrode layers of the neighboring FinFETs, which share the gate contact.

According to a third aspect of the invention, a method for fabricating a Fin field effect transistor is provided. The method comprises the steps:

providing a substrate with a single-crystalline active semiconductor layer on an insulating substrate layer;

patterning the active semiconductor layer to form source and drain layer sections, a fin-shaped layer section extending along a longitudinal fin direction between the source layer-section and the drain layer-section, and two allocated contact-post layer sections at a distance to two opposite side faces of the fin-shaped layer-section, fabricating gate insulation layers on the two opposite side faces of the fin-shaped layer-section, fabricating two gate-electrode layers on the substrate layer, each of the two gate-electrode layers facing one of the opposite side faces of the fin-shaped layer-section and filling the distance between the fin-shaped layer section and the respective contact-post layer section, and, fabricating separate gate contacts on the contact-post layer sections, each gate contact connecting with one respective gate electrode layer.

The method of the third aspect of the invention shares the advantages of the FinFET of the first aspect of the invention. In the following, embodiments of the method of the invention will be described.

One embodiment comprises, before patterning the active semiconductor layer, a step of depositing a hard mask, which hard-mask is stable against a first etching agent that attacks the gate-electrode layers. The total thickness of the composite hard mask is typically between 30 and 60 nm. The hard mask should be made of materials other than the semiconductor material. Suitable materials are, e.g., silicon dioxide, silicon nitride, or silicon oxynitride.

Depending on the further processing, the hard mask has different layer structures in different embodiments. In one embodiment, the hard mask is fabricated as single layer. In an alternative embodiment, a composite hard mask is formed by depositing a first hard-mask layer on the active semiconductor layer and a second hard-mask layer on the first hard-mask layer, which hard-mask layers are stable against a first etching agent that attacks the gate-electrode layer. The first and second hard-mask layers are mutually stable against etching agents that attack the respective other hard-mask layer. This gives flexibility in selectively removing sections of the second hard-mask layer from the first mask-layer.

The mutual selectivity is useful, for instance, in one embodiment, that comprises the steps of selectively removing the second hard mask layer from the source and drain layer sections after patterning the gate-electrode material layer;

selectively removing the first hard mask layer from the source and drain layer sections;

siliciding a surface of the source, drain and gate layer-sections of the active semiconductor layer, and a surface of portions of the fin-shaped layer-section outside the channel regions.

Here, the second hard-mask layer is preferably removed from the first hard-mask layer in the source and drain layer-sections in a photolithography step. The embodiment enables a common ion implantation of source, drain and gate layer sections, and after activation anneal, common silicidation of the source, drain and gate layer-sections, and some sections of the fin-shape layer-section outside the channel region.

In one embodiment, after the step of patterning the gate-electrode-material layer and after the step of etching the gate-electrode material layer, a step of depositing an electrically insulating spacer layer is preferably performed. The spacer layer laterally abuts the patterned sections of the active semiconductor layer.

In a further embodiment fabricating the gate-electrode layers comprises conformally depositing a contiguous gate-electrode-material layer on the patterned active semiconductor layer;

patterning the gate-electrode-material layer to cover a strip extending in one lateral direction from the first contact-post layer section to the second contact-post layer section, and in a second lateral direction, which corresponds to the longitudinal direction of the fin-shaped layer section, over desired channel regions of the fin-shaped layer section between the source and drain layer sections, etching the gate-electrode material layer anisotropically, thus separating the gate-electrode material layer into the two gate-electrode layers.

The processing of the present embodiment allows fabricating the FinFET without the use of a CMP step for providing separate gate-electrode layers. Using the method of the invention, the gate contacts can be formed in a self-aligned way. This enables not only to skip a cost-intensive and critical contact photolithography, but overcomes also overlay problems of contact and poly photolithography.

The anisotropic etching is preferably performed using the second hard-mask layer as an etch stop. The process window for this step is defined by the thickness of the gate electrode thickness, and the ratio between the heights of the hard mask and the fin-shaped layer section. The objective of this step is to interrupt the gate electrode strip in two distinct parts, which can be contacted independently later on.

A further embodiment comprises the steps:

removing the second and first hard-mask sections from the contact-post layer sections of the active semiconductor layer;

conformally depositing a dielectric layer;

fabricating openings in the dielectric layer that reach to the surface of the contact-post layer sections;

fabricating contacts in the opening.

A self-aligned fabrication of the gate contacts is achieved in an embodiment, which comprises removing the hard mask from the contact posts and from the source and drain layer sections after patterning the gate-electrode material layer;

fabricating a dielectric layer that covers the fin-shaped layer section;

selectively depositing semiconductor material on the contact posts and on the source and drain layer sections;

siliciding the semiconductor material.

The selective deposition is preferably performed as selective epitaxy of the same semiconductor material as that used for the active semiconductor layer. In this context, selective epitaxy refers to an epitaxy of semiconductor material only on the exposed semiconductor surfaces, not, e.g., on metal surfaces or insulator surfaces. The self-aligned contact formation preferably includes the formation of source and drain contacts in the same manner as for the gate contacts. The deposited semiconductor material is also referred to as contact plugs herein.

The present embodiment can be performed using a hard mask in the form of a single layer. The gate-electrode material layer for the process including self-aligned contact formation is preferably full metal or poly-Si capped by metal in a way, that before epitaxy, no poly-Si is exposed on the gate-electrode layers. The gate-electrode material layer should have sufficient thermal stability to withstand the epitaxy. If silicon is used, stability at 700° C.-800° C. for Si, 500°-600° C. for the equally suitable SiGe is required.

The silicidation step is omitted in some embodiments. In these embodiments, the contact plugs can be doped to appropriate levels to decrease the contact resistance. However, the silicidation of the self-aligned contact plugs is preferred after the epitaxy step in order to lower the resistivity of the contacts. Ideally, the total contact plugs are consumed by the silicidation. In this case no doping of the contact plugs is needed.

In one form of this embodiment, the material of the gate-electrode layer is a metal. However, poly-Si with a metal capping could equally be used. This allows obtaining a selectivity for an epitaxy step used for the gate-contact formation.

Further embodiments of the FinFET and of the method for fabricating the FinFET are defined in the dependent claims.

BRIEF DESCRIPTION OF THE DRAWINGS

The invention will now be explained in more detail with reference to the drawings in which

FIGS. 22 to 38 show different views of a second embodiment of a FinFET at different stages of its fabrication, according to a second embodiment of a fabrication method of the invention.

DETAILED DESCRIPTION OF EMBODIMENTS

FIGS. 1 to 19 show different views of an embodiment of a FinFET at different stages of its fabrication, according to an embodiment of a fabrication method of the invention.

Figure 1:
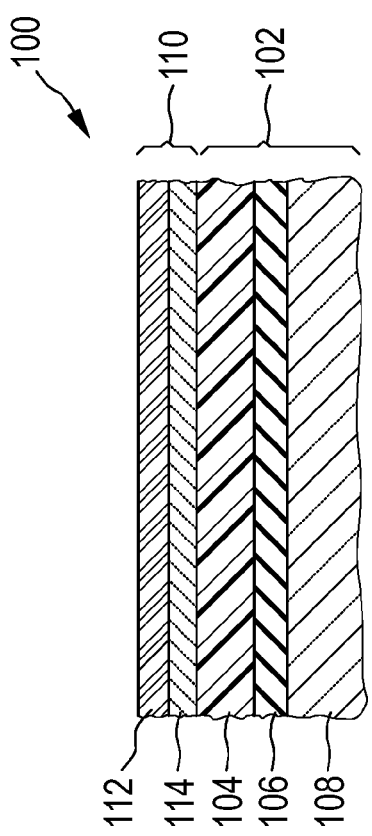
FIGS. 1 to 19 show different views of an embodiment of a FinFET at different stages of its fabrication, according to an embodiment of a fabrication method of the invention.

FIG. 1 shows a cross-sectional view of a FinFET 100 during a first fabrication stage of a FinFET. Note that the finished FinFET 100 is only shown in FIGS. 18 and 10. The reference numeral 100, however, will in the following also be used to denote a region, in which the FinFET 100 is fabricated, during the different processing stages of its fabrication.

The FinFET fabrication starts on a semiconductor-on-insulator (SOI) substrate 102 with a single-crystalline silicon layer 104, an underlying insulating layer 106 on a silicon wafer 108. The single-crystalline silicon layer 104 forms an example of an active semiconductor layer, which will be patterned during subsequent processing stages for forming source, drain and fin-shaped layer sections as well as contact-post layer sections. Other semiconductor materials may be used for the active semiconductor layer 104. The active semiconductor layer 104 has a thickness that defines the future height of the fin-shaped layer section, which is typically between 20 and 100 nm, preferably between 40 and 80 nm.

At the processing stage shown in FIG. 1, the SOI substrate 102 has been subjected to a masked channel implantation (not shown). In some embodiments, no channel implantation is performed. The SOI substrate 102 has further been capped by a hard mask 110 comprising a top hard-mask layer 112 and a bottom hard-mask layer 114. The top hard mask-layer 112 forms the second hard-mask layer mentioned previously in the claims, whereas the bottom hard-mask layer 114 forms the first hard-mask layer previously mentioned. The hard-mask layers 112 and 114 are made from a material that is different from the active semiconductor material 104. The bottom hard-mask layer 114 is stable against an etching agent that attacks the top hard-mask layer 112. Furthermore, the material of the top hard-mask layer 112 is selected to be stable against an etching agent that attacks a gate-electrode layer to be deposited in a later processing step. The top hard-mask layer 112 may for instance be made of silicon nitride. The bottom hard-mask layer may for instance be made of silicon dioxide. This material combination has the advantage of allowing a selective removal of the bottom hard-mask layer from source and drain regions without attacking a spacer 140 in a later processing step. Furthermore, with this material choice, the bottom-mask layer 114.1 to 114.3 can be removed without attacking the Silicon of the underlying fin-shaped layer section 116 and the contact posts 118 and 120. Finally, the top and bottom hard-mask layers can be removed without attacking a metal silicide layer to be fabricated in a later processing step. Still, other material combinations will be apparent to a person of ordinary skill in the art from the above functional description of advantageous properties of the bottom and top hard-mask layers, in the light of known etching agents. The total thickness of the hard mask 110 is typically between 30 and 60 nm.

Figure 3:
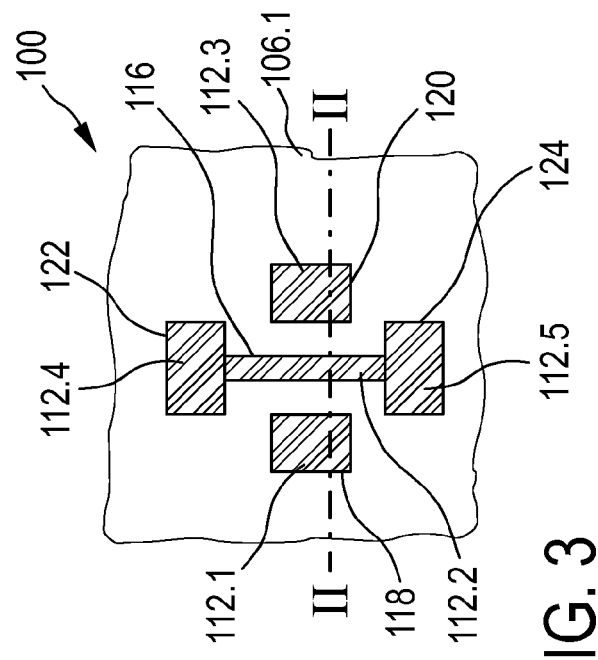
Figure 2:
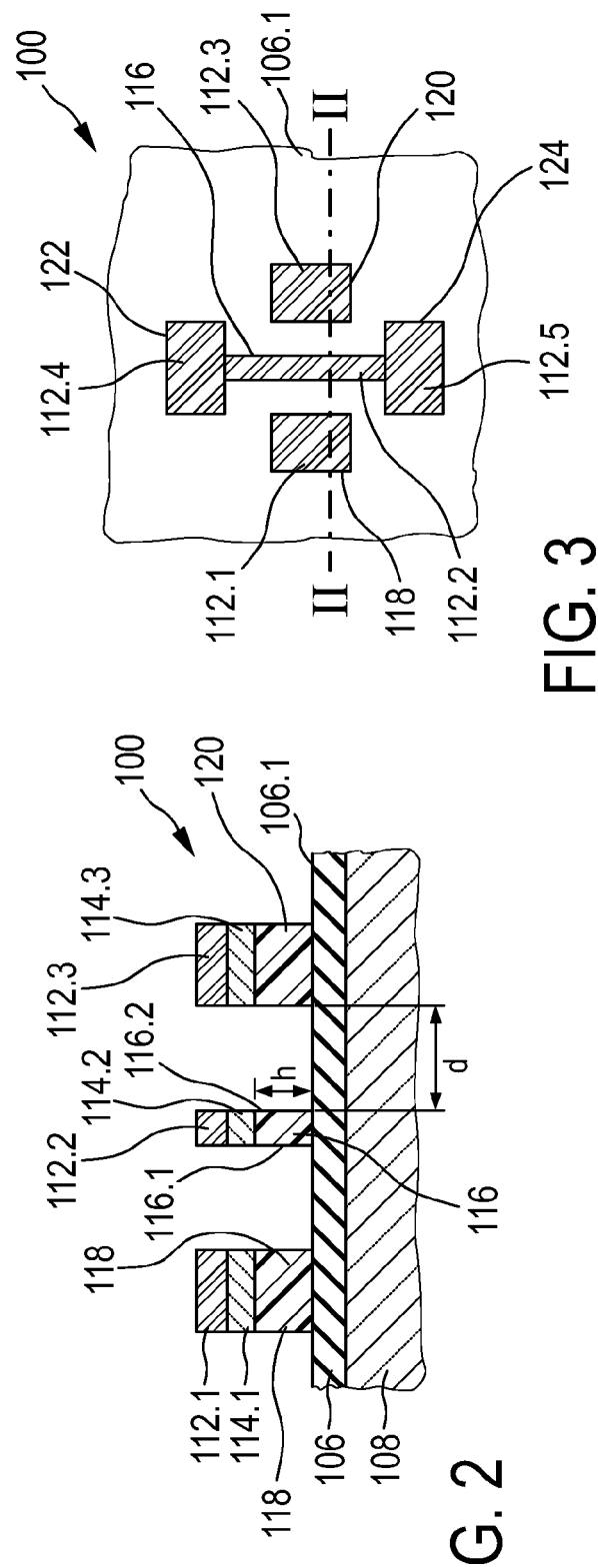

FIGS. 2 and 3 show the FinFET 100 at a second processing stage. FIG. 2 is a schematic cross-sectional view along the line II-II shown in FIG. 3. FIG. 3 is a schematic top view of the FinFET 100 at the second processing stage.

At the processing stage shown in FIGS. 2 and 3, a photolithography step has been carried out in order to pattern the active semiconductor layer 104 for the definition of a fin-shaped layer section 116, first and second contact-post layer section 118 and 120, as well as source and drain layer-sections 122 and 124. In between these patterned layer sections, a surface 106.1 of the underlying insulating layer is exposed. As can be seen in the top view of FIG. 3, the fin-shaped layer section 116 extends between the source layer section 122 and the drain layer section 124 along its longitudinal fin direction. The first and second contact-post layer sections 118 and 120 are arranged at a lateral distance d from side faces 116.1 and 116.2 of the fin-shaped layer section 116, respectively. The contact-post layer sections 118 and 120 will in the following also be referred to in short as gate-contact posts.

At this processing stage, the two hard-mask layers 112 and 114 remain on the patterned active layer sections. The first gate-contact post 118 is arranged under the hard-mask sections 112.1 and 114.1. The fin-shaped layer section 116 is covered by the hard-mask sections 112.2 and 114.2. The second contact-post section 120 is covered by the hard-mask sections 112.3 and 114.3. The source layer section 122 has mask-layer sections 112.4 and 114.4 on top of it, and the drain layer section 124 carries mask-layer sections 112.5 and 114.5.

The lateral distance d between the fin-shaped layer section 116 and the neighboring gate-contact posts 118 and 120, respectively, is chosen smaller than 1.5 times the thickness of a gate-electrode layer to be deposited during later processing steps. This allows a large freedom for the scalability of the FinFET. The minimum distance d is determined by the resolution limit of electron-beam lithography and is of the order of 30 nm.

Figure 5:
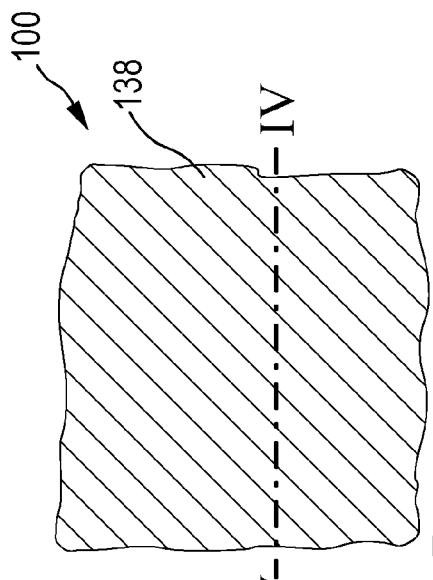
Figure 4:
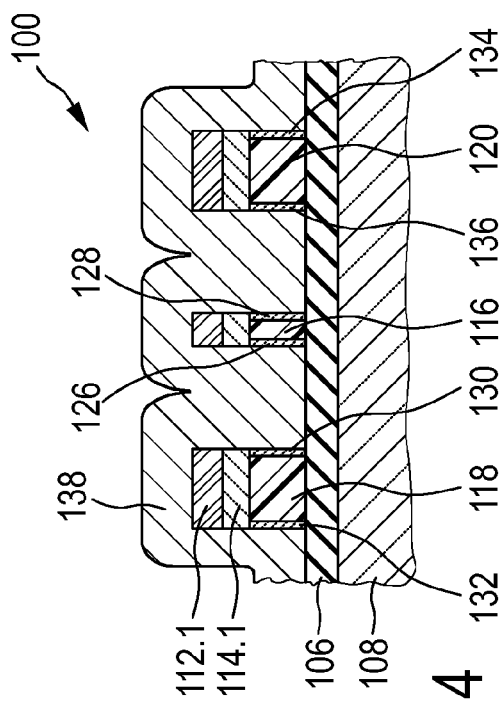

FIGS. 4 and 5 show the FinFET 100 during a third processing stage. FIG. 4 shows a schematic cross-sectional view along the line IV-IV in FIG. 5. FIG. 5 shows a top view.

After the photolithography for patterning the active semiconductor layer 104, gate oxide layers 126 and 128, which are more generally referred to as gate insulation layers, have been formed on the side faces 116.1 and 116.2, respectively. The gate-oxide layers 126 and 128 can be fabricated either by a thermal growth. For example, if the active semiconductor layer 104 is made of silicon, an example of a suitable gate oxide that can be grown by this method is $SiO_2$. In a thermal oxidation step, the gate oxide is only formed on exposed semiconductor areas. With a similar processing, but in an atmosphere containing also reactive nitrogen in a sufficient amount, a thermal SiON layer can be deposited as the gate insulation layer. In an alternative embodiment, which is not shown in the Figures, a dielectric material is deposited uniformly. This processing allows to choose from a wider selection of a suitable gate-insulator materials. For instance, instead of $SiO_2$ or SiON, a high-k dielectric material can be selected, such as an oxide of a rare-earth element, e.g., hafnium oxide $HfO_2$. FIG. 4, however, shows the case of a thermal oxidation of $SiO_2$. In this processing, oxide layers are also formed on side faces of the gate-contact posts 118 and 120, shown under reference labels 130 to 136, and on other exposed top faces, from which they have to be removed. In case of a High-K gate oxide material, there would be a conformal deposition of this material just before the deposition of the gate-electrode material. This would include a deposition on side and top faces of the hard masks. The High-K material would be advantageously removed from these top surfaces after etching of the gate-electrode material, by dry or wet cleaning methods in order to enable the removal of the hard masks in the following.

After the formation of the gate oxide, a gate-electrode material layer 138 is deposited conformally on the FinFET 100, and in one embodiment on the whole wafer surface. The gate electrode material is polycrystalline silicon (polysilicon) in the present embodiment. However, a metal could equally be used. A metal surface has the advantage of providing selectivity to an epitaxy step used at a later processing stage in one embodiment for a contact formation. The metal surface can also be provided by a metal capping on the polysilicon gate-electrode material layer 138. In another embodiment not shown here, a layer sequence in the form of a hetero-stack is used, containing for instance a poly-silicon layer and a metal layer is used, in particular in the form of a gate liner containing a poly-silicon layer on a metal layer. Other materials like SiGe or Ge could be used in different embodiments.

Figure 7:
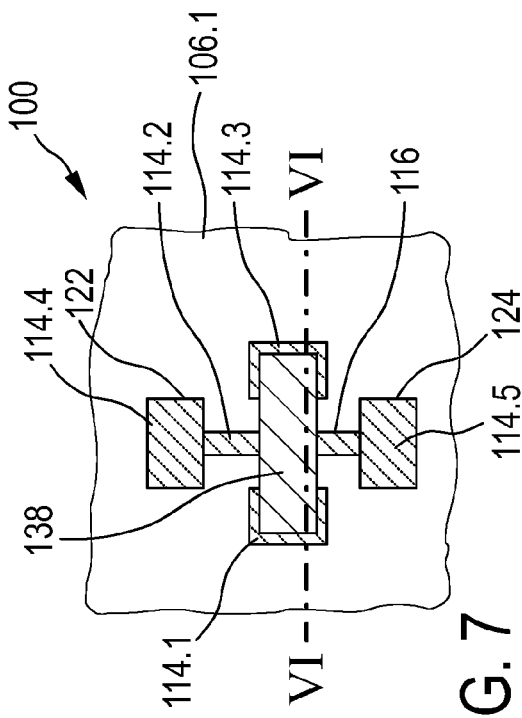
Figure 6:
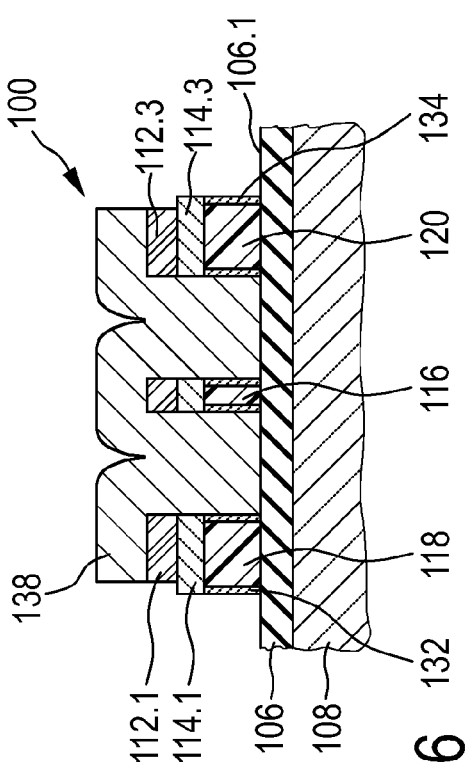

FIGS. 6 and 7 show the FinFET 100 during a fourth processing stage. FIG. 6 is a cross-sectional view along the line VI-VI shown in FIG. 7. FIG. 7 is a top view of the FinFET 100.

With reference to FIG. 7, the gate-electrode material layer 138 has been patterned to form a strip (shown under the same reference label 138). The strip made from the gate-electrode material layer 138 extends along the sectional line VI-VI from the first to the second gate-contact post. In a lateral direction perpendicular to the line VI-VI, the strip made from the gate-electrode material layer 138 extends over a desired channel region in the fin-shaped layer section 116. The patterning of the gate-electrode material layer 138 is performed by photolithography and etching. Note that the etching agent used attacks the gate-electrode material layer 138 and the material of the top hard mask 112, but not the material of the bottom hard mask 114. Therefore, the top hard mask 112 is removed from the source and drain layer sections 122 and 124, as well as from the fin-shaped layer section 116 and from edges of the gate-contact posts 118 and 120, as defined by the photolithography mask (not shown). The oxide layers 132 and 134 on outer side faces of the contact posts 118 and 120 are in one embodiment, which is not shown in the Figs., partially or completely removed at this processing stage during a wet clean process after the patterning of the gate-electrode material layer 138.

Figure 8:
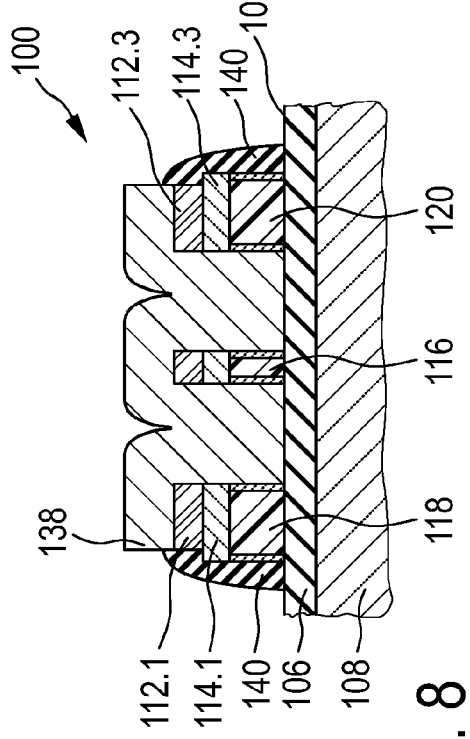
Figure 9:
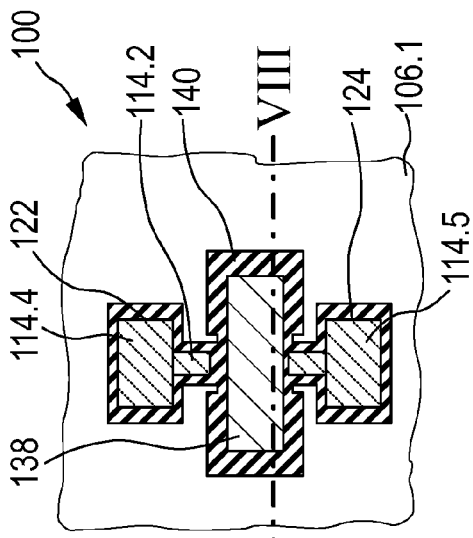

FIGS. 8 and 9 show the FinFET 100 at a fifth processing stage. FIG. 8 is a cross-sectional view along the line VIII-VIII shown in FIG. 9. FIG. 9 is a top view of the FinFET 100.

A lateral spacer 140 has been fabricated from an insulating material. It surrounds the patterned regions on the insulating substrate layer 106. A suitable insulating material is for instance silicon nitride.

Figure 10:
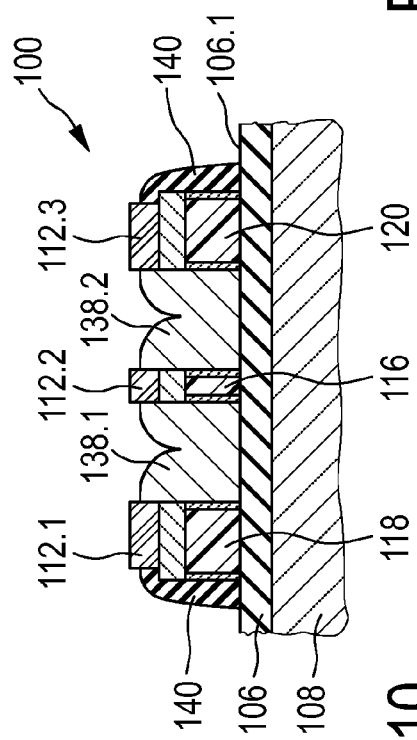
Figure 11:
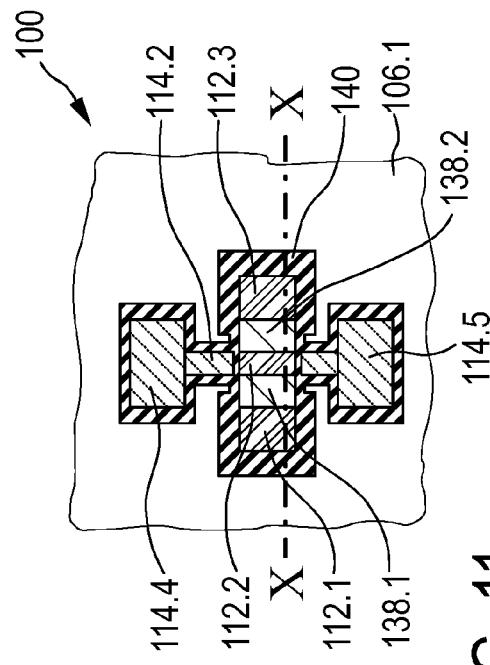

FIGS. 10 and 11 show the FinFET 100 at a sixth processing stage. FIG. 10 is a cross-sectional view along the line X-X in FIG. 11. FIG. 11 is a top view of the FinFET 100.

An anisotropic etching step has been carried out removing material from the strip-shaped gate-electrode material layer 138. The thinning process achieved by the anisotropic etching is continued until the strip is separated into two separate sections forming gate-electrode layers 138.1 and 138.2 on the two opposite sides of the fin-shaped layer section 116. The processing window for this step is defined by the thickness of the gate-electrode material layer 138 before the etching step and by the ratio between the heights of the hard mask 110 and the fin-shaped layer section 116. The etching agent for the anisotropic etching step is selected such that the top—hardmask layer 112 is not attacked. If the material of the top hard-mask layer 112 is silicon nitride, suitable etching agents providing selectivity towards silicon nitride are HCl, HBr, or SF6.

Figure 12:
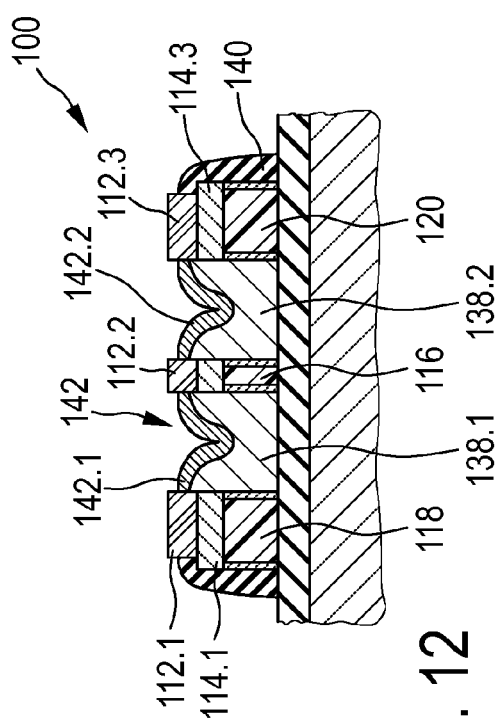
Figure 13:
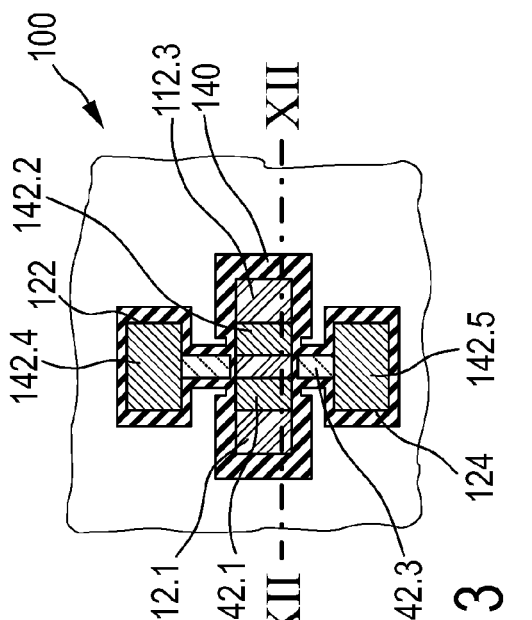

FIGS. 12 and 13 show the FinFET 100 at a seventh processing stage. FIG. 12 is a cross-sectional view along the line XII-XII in FIG. 13. FIG. 13 is a top view of the FinFET 100.

The hard mask 110 has been removed from the source and drain layer sections 122 and 124 and from the fin-shaped layer section 116 in regions other than the channel region. The hard mask 110 remains only on the gate-contact posts 118 and 120, and on the channel region of the fin-shaped layer section 116. The exposed active semiconductor regions mentioned are then silicided, leading to first and second metal silicide layer sections 142.1 and 142.2 on the first and second gate-electrode layers 138.1 and 138.2, respectively, and to third, fourth and fifth metal silicide layer sections 142.3 to 142.5 on the fin-shaped layer section, except for the channel region, the source and the drain regions.

Figure 14:
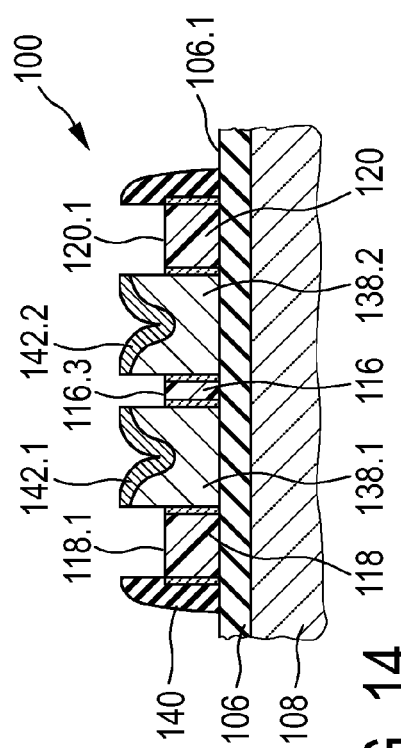
Figure 15:
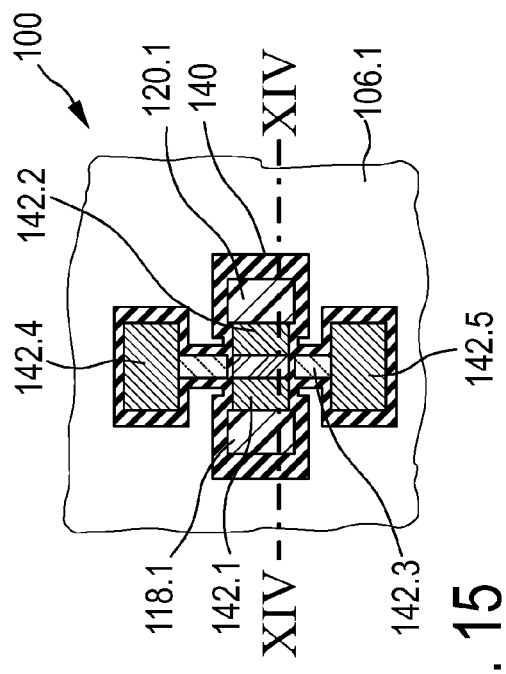

FIGS. 14 and 15 show the FinFET 100 during an eighth processing stage. FIG. 14 is a cross-sectional view along the line XIV-XIV in FIG. 15. FIG. 15 is a top view of the FinFET 100.

At this processing stage, the remaining sections 112.1, 114.1, 112.2, 114.2, and 112.3, 114.3 of the composite hardmask have been removed from the channel region of the fin-shaped layer section 116, from and gate-contact posts 118 and 120, thus exposing their respective top surfaces 116.3, 118.1, and 120.1.

Figure 17:
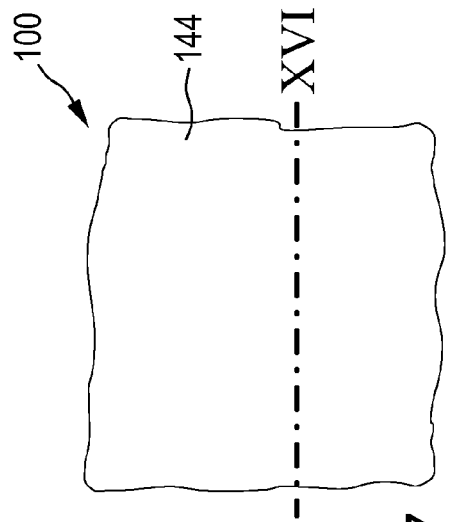
Figure 16:
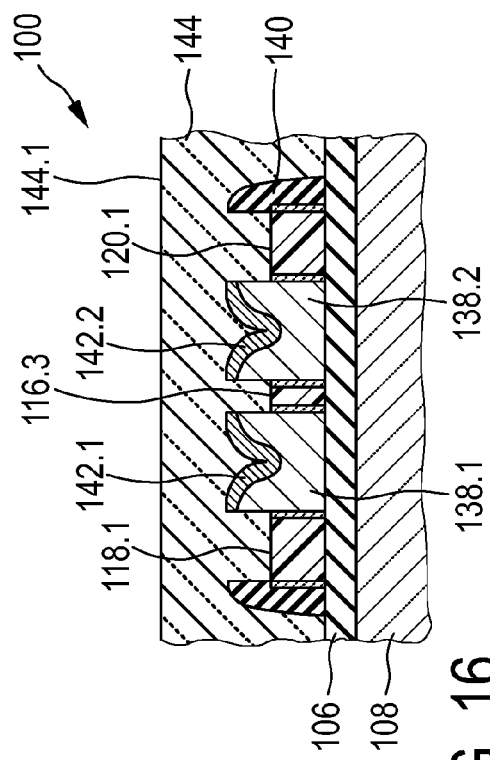

FIGS. 16 and 17 show the FinFET 100 at a ninth processing stage. FIG. 16 is a cross-sectional view of the FinFET 100 along the line XVI-XVI. FIG. 17 is a top view of the FinFET 100.

A dielectric layer 144 has been deposited on the wafer. In a common CMOS flow, a thin nitride layer (30 nm) is deposited before depositing a thick PSG layer (>200 nm). In general, however, any kind of nitride could be used, and a deposited oxide with low deposition temperatures (<450° C.) for advanced technologies.

Figure 19:
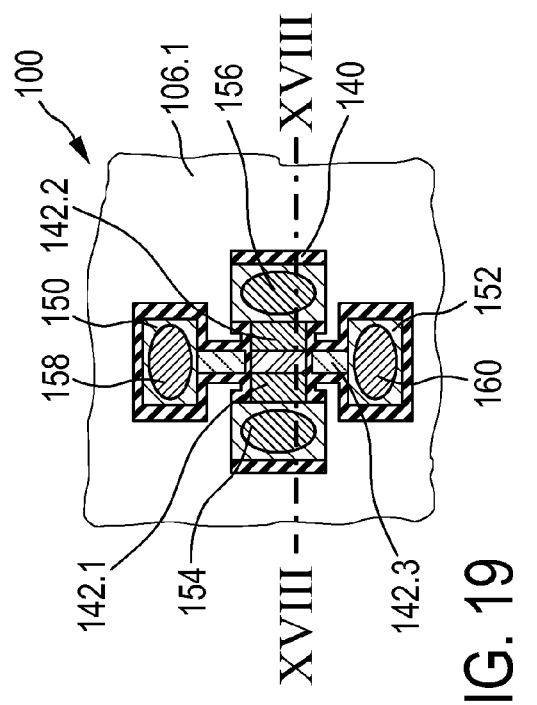
Figure 18:
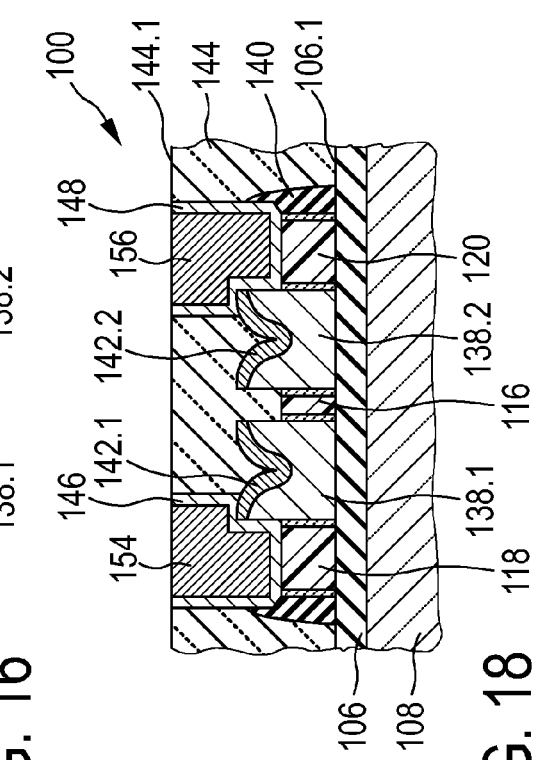

FIGS. 18 and 19 show the FinFET 100 at a tenth processing stage, after finishing its fabrication. FIG. 18 is a cross-sectional view of the FinFET 100 along the line XVIII-XVIII in FIG. 19. FIG. 19 is a schematic top view corresponding to a hypothetical situation, in which the dielectric layer 144 is removed. At this stage, contact openings have been formed in the dielectric layer 144 by a photolithography and etching step. They are then filled with electrically conductive material to form contacts. In the present example, the contacts comprise liners 146 to 152 on the bottom face and the side faces of the contact openings. Finally, the openings are filled with a metal, such as tungsten W to form a first gate contact 154, a second gate contact 156, a source contact 158 and a drain contact 160. Known techniques such as Copper-based damascene or dual damascene technology can be used to fabricate an interconnect stack on top of the FinFET 100.

The gate contacts 154 and 156 are arranged abutting the top faces 118.1 and 120.1 of the contact-post layer sections 118 and 120 of the original single-crystalline active semiconductor layer 104. Furthermore, they contact respective side faces of the gate-electrode layers 138.1 and 138.2. As can be seen in FIG. 18, the shape of the gate contacts resembles an inverted L or, in other words, the Greek letter Γ. However, alternative shapes of the contact are possible. Note, that in the present embodiment the contact-posts 118 and 120 and the fin-shaped layer section 116 have equal heights above insulating substrate layer 106.

Figure 20:
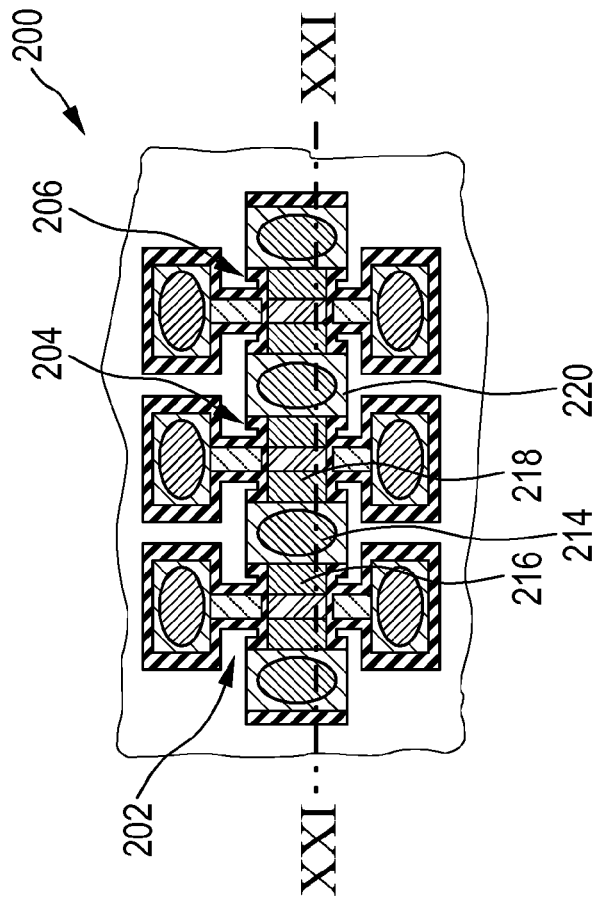
FIG. 20 shows a schematic top view of an embodiment of a FinFET arrangement.
Figure 21:
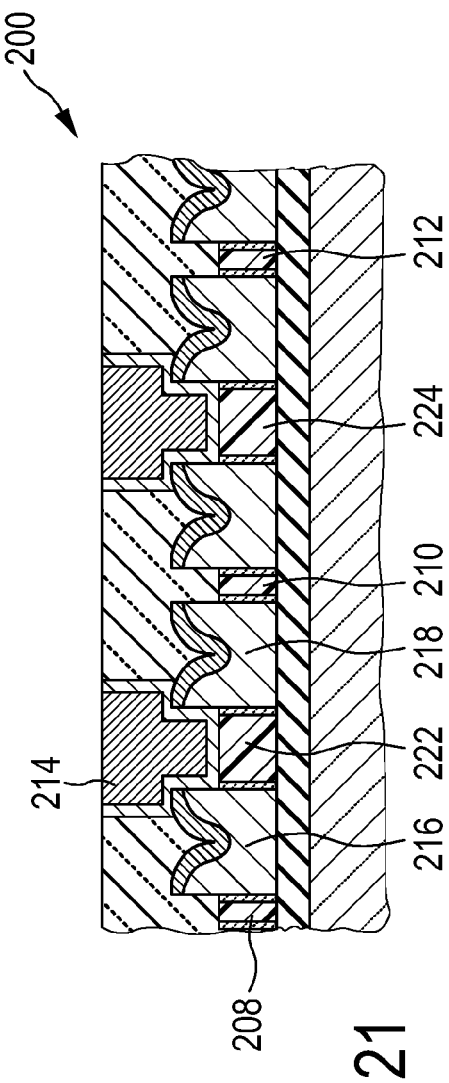
FIG. 21 shows a schematic cross-sectional view of the FinFET arrangement of FIG. 20.
Figure 22:
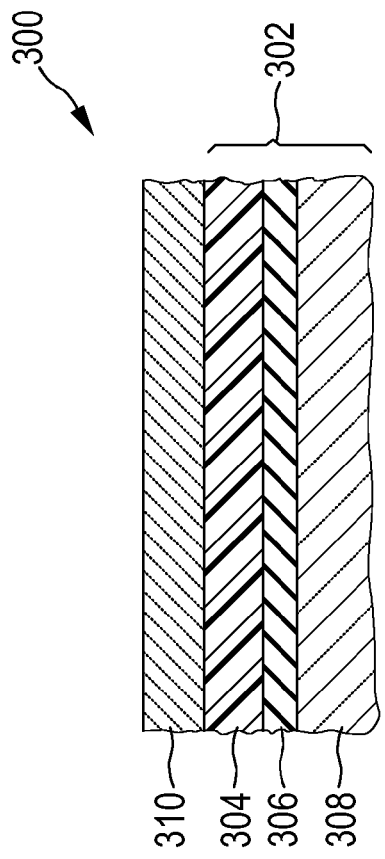
Figure 23:
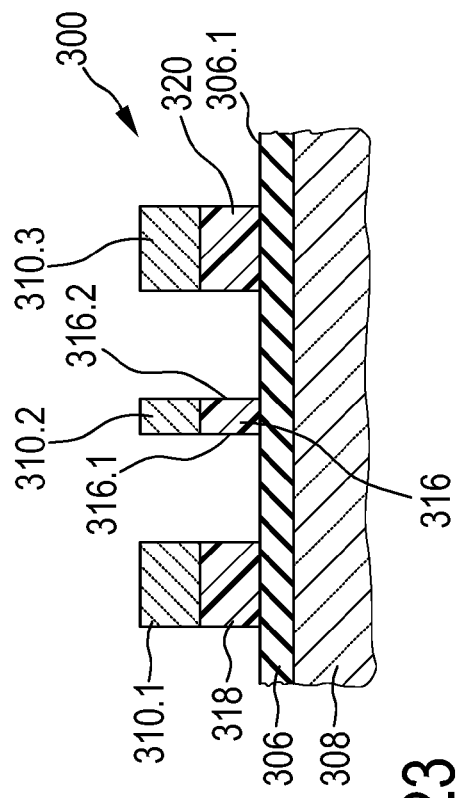
Figure 24:
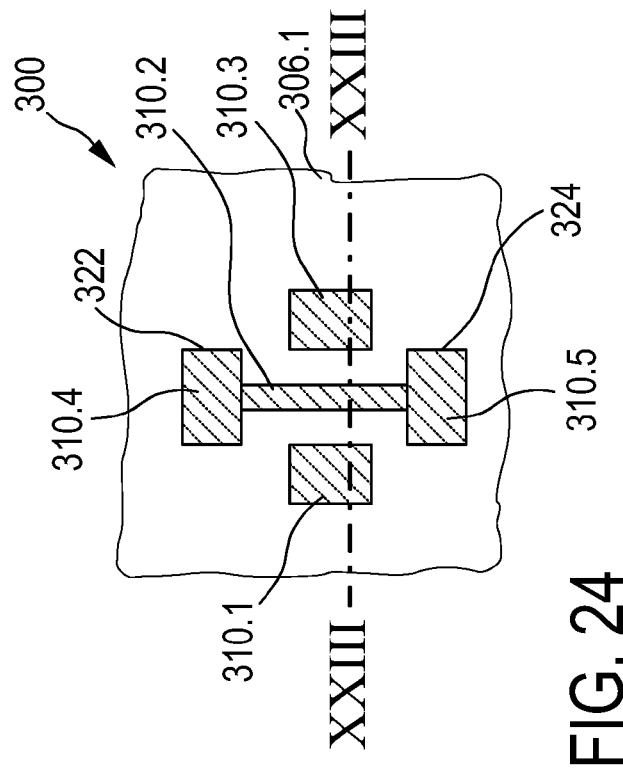

FIGS. 20 and 21 show an embodiment of a FinFET arrangement 200. FIG. 20 is a top view arrangement 200. FIG. 21 is a cross-sectional view along the line XXI-XXI in FIG. 20. The FinFET arrangement is a combination of three FinFETs 202, 204 and 206 with fin-shaped layer sections 208, 210 and 212. The general structure of the individual FinFETs corresponds to the structure of the FinFETs 118 and 119. However, two respective neighboring FinFETs share one gate contact. For example, the gate contact 214 is used to address the gate-electrode layer 216 of the FinFET 202 as well as the gate electrode layer 218 of the FinFET 204. As can be seen in the cross-sectional view of FIG. 21, the shared gate contacts 214 and 220 on the gate contact posts 222 and 224 have a shape resembling the letter T. This allows contacting both neighboring gate-electrodes 216 and 218.

FIGS. 22 to 38 show different views of a second embodiment of a FinFET at different stages of its fabrication, according to a second embodiment of a fabrication method of the invention. Reference labels used in FIGS. 22 to 38 for like parts differ from those used in FIGS. 1 to 19 only in the first digit, which is "3" instead of "1".

As in the previous embodiment, the different processing stages will be described with reference to cross-sectional and top views at the respective processing stages. As before, structural elements in the top view have identical hatching as in the cross-sectional view to increase clarity of the graphical representation. The top views of FIGS. 24, 26, 28, 30, 32, 34, 36, and 38 contain lines marked by respective Roman numbers, which indicate the position of the cross-sectional planes shown in FIGS. 23, 25, 27, 29, 31, 33, 35, and 37, respectively.

The present embodiment differs from the embodiment of FIGS. 1 to 19 in that it provides a process for a self-aligned fabrication of contacts for the source electrode, the independent gate electrodes, and for the drain electrode of the FinFET.

At a beginning stage of the process, a substrate 302 is provided underneath the hard mask 310, which has the same layer structure as that of the previous embodiment, comprising a semiconductor layer 304, which in the present embodiment is a silicon layer 304, and an insulating substrate layer 306 on a silicon wafer 308. In the present processing embodiment, a simplified hard mask 310 is used, in comparison with the previous embodiment. A suitable material for the hard mask is silicon nitride, or silicon oxide.

Reference is now made to FIGS. 23 to 28. The processing stage shown in FIGS. 23 and 24 corresponds to that of FIGS. 2 and 3. The silicon layer 304 and the hard mask 310 have been patterned to form a fin-shaped layer region 316 and contact posts 318 and 320, as well as source and drain layer-sections 322 and 324. In between these patterned layer sections, a surface 306.1 of the underlying insulating layer 306 is exposed. Subsequently, with reference to FIGS. 25 and 26, gate oxide layers 326 and 328 are formed by thermal oxidation on side faces 316.1 and 316.2 of the fin-shaped layer 316. As mentioned in the context of the previous embodiment, a uniform deposition of a dielectric material is a possible alternative here. However, this would require removal of the dielectric material from surface sections other than the side walls 316.1 and 316.2 of the fin-shaped layer section 316. Subsequently, still with reference to FIGS. 25 and 26, a suitable gate-electrode material layer 338 is deposited conformally on the wafer. Advantageously, a metal is used for the gate-electrode material layer 338. However, polysilicon with a metal capping could equally be used. Next, still referring to FIGS. 25 and 26, the gate-electrode material layer 338 is patterned into a strip shape by photolithography and etching. The remaining gate strip reaches from contact post 318 to contact post 320 and covers the channel region of the FinFET transistor 300. After that, spacers 340 are formed to insulate the channel fin electrically.

Next, as can be seen in FIGS. 27 and 28, an anisotropic etching step is carried out for removing a part of the gate-electrode material layer 338 from the top of the fin-shaped layer section 316, thus interrupting the gate-electrode material layer and forming two independent gate-electrode layers 338.1 and 338.2. The process window for this step is defined by the thickness of the gate-electrode-material layer, and by the ratio between the heights of the hard mask 310 and the fin-shaped layer section 316.

Figure 29:
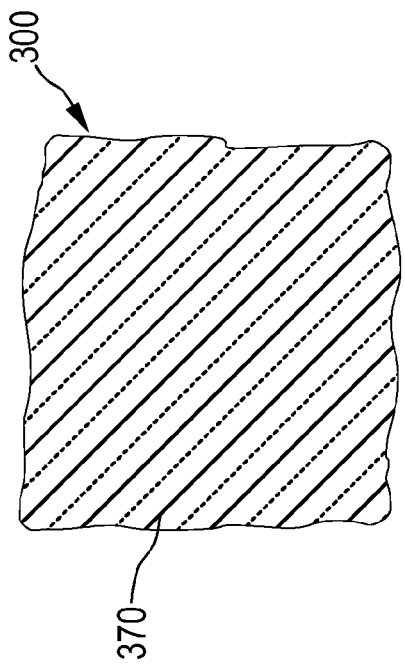
Figure 30:
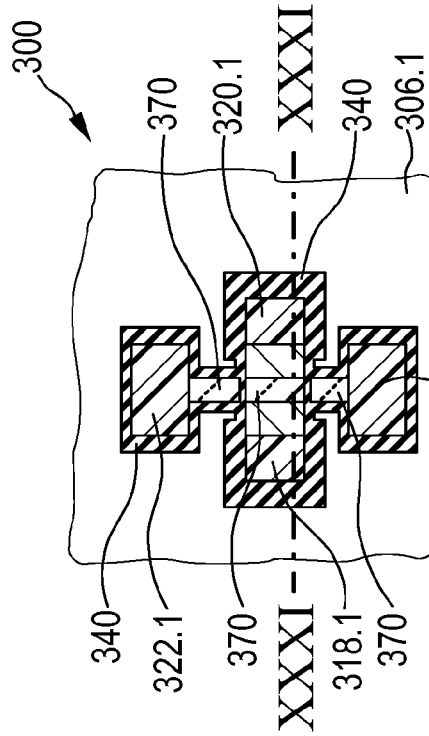
Figure 31:
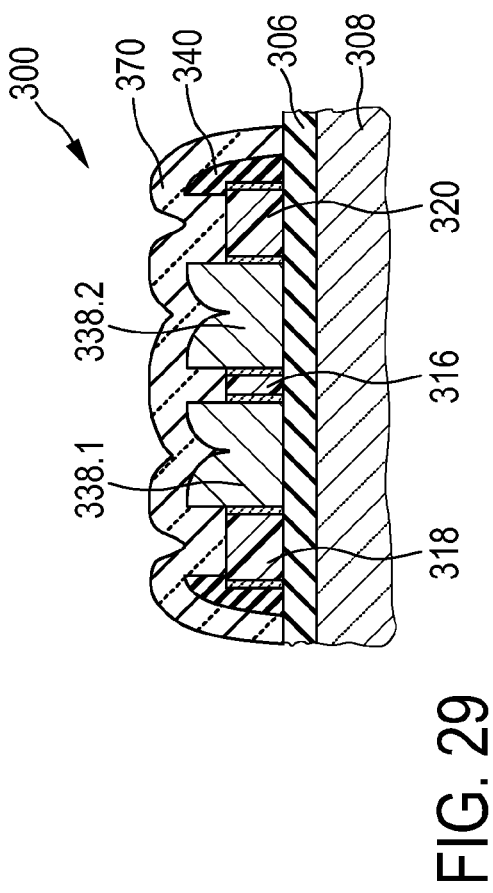
Figure 32:
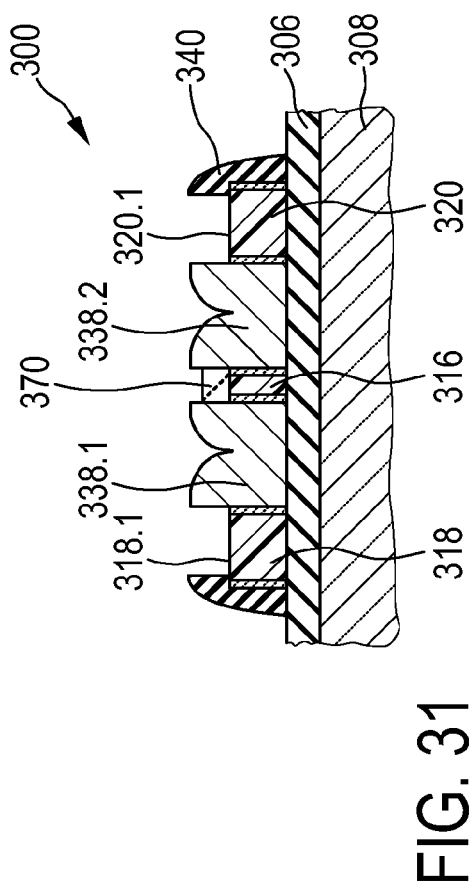

Next, now referring to FIGS. 29 and 30, the hard mask 310 is removed from the active areas, and a second dielectric-material layer 370 is deposited. The second dielectric-material layer 370 is removed by an anisotropic etching step sequence to remain only in the small cavity over the fin-shaped layer section 316, between the gate-electrode layers 338.1 and 338.2. The second dielectric-material layer 350 is completely removed from the surfaces 318.1, 320.1, 322.1 and 324.1 of the contact posts 318 and 320, and of the source and drain-layer sections 322 and 324, cf. FIGS. 31 and 32.

Figure 34:
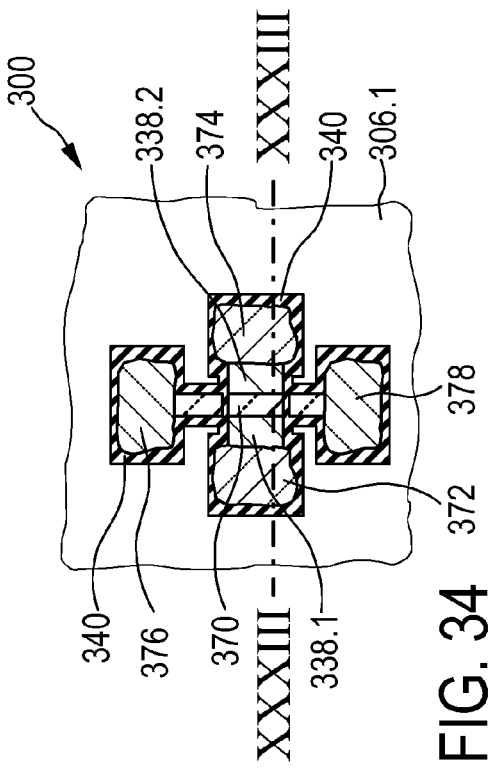
Figure 33:
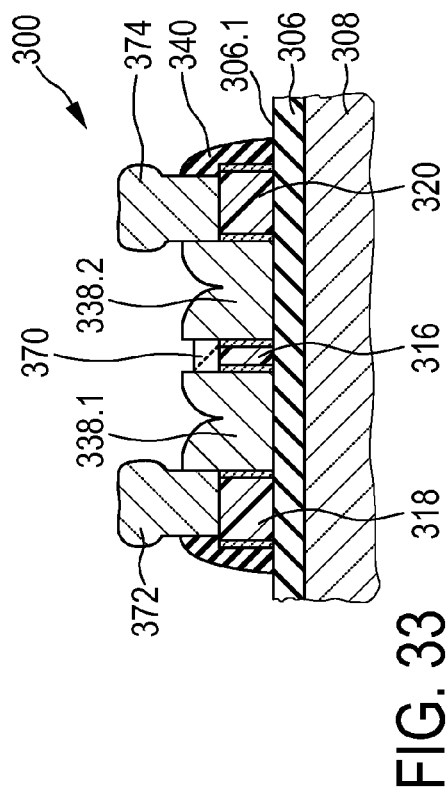

Then, with reference to FIGS. 33 and 34, a selective epitaxy of silicon is performed on the exposed silicon surfaces just mentioned, to form silicon contact plugs 372, 374, 376, and 378 on the contact posts 318 and 320, and on the source and drain-layer sections 322 and 324. No silicon will be deposited in this processing step on the gate-electrode layers 338.1 and 338.2 the selectivity of the deposition with respect to their metal surface. Also, the second dielectric-material layer 370 is chosen to prevent a deposition of silicon thereon. The selective epitaxy is performed until the contact areas formed by the contact plugs 372 to 378 are raised to an appropriate height.

Figure 36:
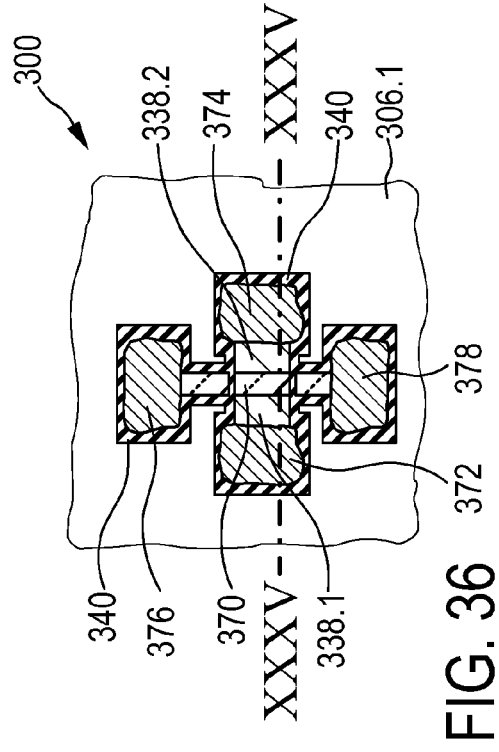
Figure 35:
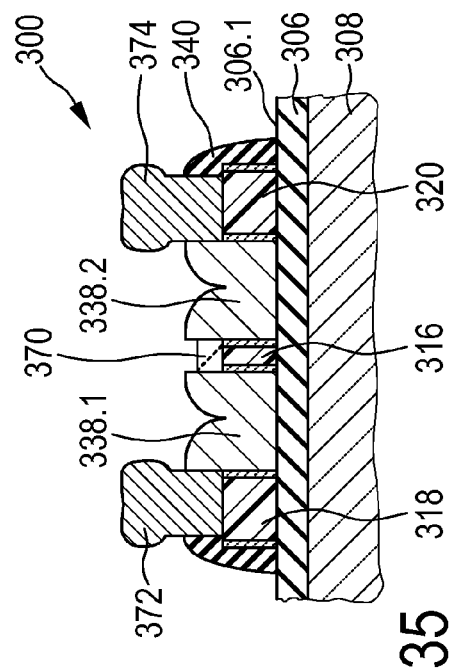
Figure 38:
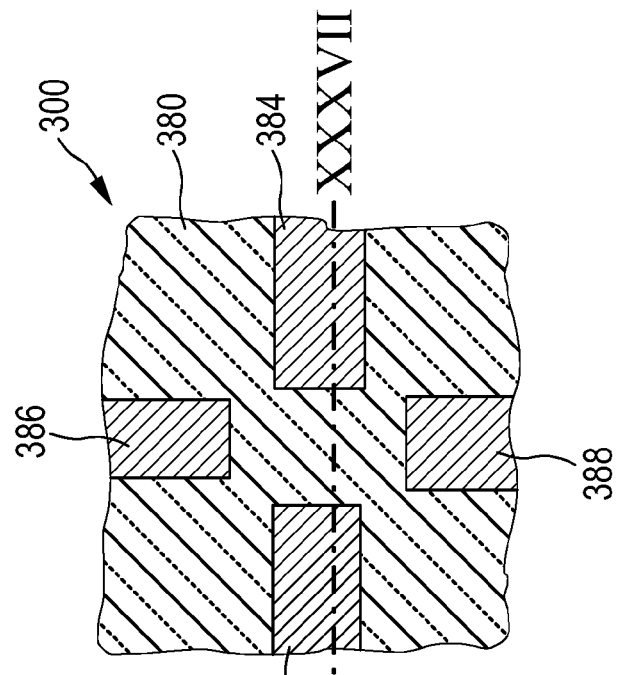
Figure 37:
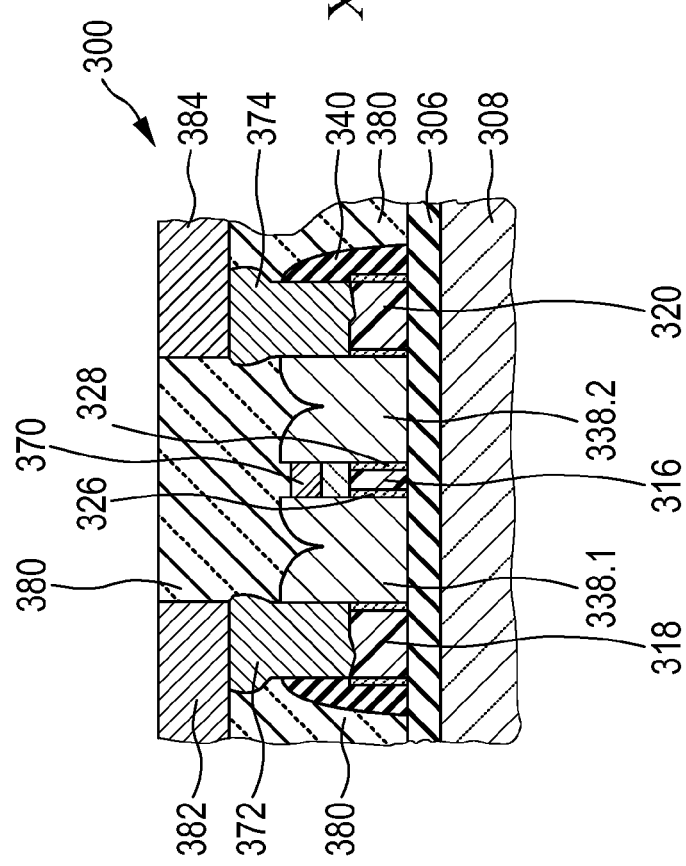

For better contact formation between a first metal layer of an interconnect structure to be deposited later on one side and the gate electrode and the source and drain electrodes on the other side, the silicon plugs 372 to 378 are silicided in a subsequent processing step, cf. FIGS. 35 and 36. After that, for a Cu-based backend processing, a third dielectric layer 380 is deposited, planarized and etched down to the contact plugs 372 to 378, for forming Cu-based contacts 382, 384, 386, and 388 to the gate-electrode contact plugs 372 and 374, and to source and drain contact plugs 386 and 388.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. While the embodiments described herein use silicon as the material of the active semiconductor layer, other semiconductor materials such as Ge, SiGe, GaAs and related binary, ternary or quaternary III-V semiconductor alloys of the InAlGaAs alloy system, InP, or other III-V semiconductors can be used as well. FinFETs with independently addressable gate electrodes also offer interesting design solutions, e.g., SRAM cells with 4 only devices.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope.

The invention claimed is:

1. A Fin field effect transistor, FinFET, comprising
a fin-shaped layer-section of a single-crystalline active semiconductor layer extending on an insulating substrate layer along a longitudinal fin direction between a source layer-section and a drain layer-section of the single-crystalline active semiconductor layer,
gate insulation layers arranged on two opposite side faces of the fin-shaped layer-section, and
two separate gate-electrode layers, which do not form sections of the single-crystalline active semiconductor layer, each of the gate-electrode layers facing one of the opposite side faces of the fin-shaped layer-section, and each gate-electrode layer being connected with a respective separate gate contact, wherein each of the gate-electrode layers, as seen in a cross-sectional view of a plane that is perpendicular to the longitudinal fin-direction, is arranged on the substrate layer between the respective side face of the fin-shaped layer section and a respective contact-post layer section of the single-crystalline semiconductor layer;

wherein the gate contacts are arranged abutting a top face of the respective contact-post layer section of the single-crystalline active semiconductor layer and a side face of the respective gate-electrode layer.

2. The FinFET of claim 1, wherein the gate contacts have the shape of an L turned upside down, the vertical bar of the L extending perpendicularly to the substrate layer from the contact-post layer section to increasing distances from the substrate layer, the horizontal bar of the L being arranged on the respective gate-electrode layer.

3. The FinFET of claim 1, wherein the fin-shaped layer-section and the contact-post layer sections of the single-crystalline semiconductor layer on the substrate layer have an equal thickness (h).

4. The FinFET of claim 3, wherein the source and drain layer sections and the fin-shaped layer-section of the single-crystalline semiconductor layer on the substrate layer have an equal thickness (h).

5. The FinFET of claim 1, comprising a metal silicide layer between the contact-post layer sections of the active semiconductor layer and the gate contacts.

6. The FinFET of claim 1, wherein a lateral distance (d) between the fin-shaped layer section and a respective contact-post layer section of the single-crystalline semiconductor layer is smaller than 2 times the thickness of the gate-electrode layer.

7. A FinFET arrangement containing a plurality of neighboring FinFETs according to claim 1, wherein two neighboring FinFETs share one gate electrode layer, one contact-post layer section and one gate contact.

8. The FinFet arrangement of claim 6, wherein the shared gate contact has a T-shape, and two wings of the horizontal T-bar of the gate contact are arranged on gate-electrode layers of the neighboring FinFETs, which share the gate contact.

9. A method for fabricating a Fin field effect transistor, FinFET, comprising the steps:

providing a substrate with a single-crystalline active semiconductor layer extending on an insulating substrate layer;

patterning the active semiconductor layer to form source and drain layer sections, a fin-shaped layer section extending along a longitudinal fin direction between the source layer-section and the drain layer-section, and two allocated contact-post layer sections at a distance (d) to two opposite side faces of the fin-shaped layer-section, fabricating gate insulation layers on the two opposite side faces of the fin-shaped layer-section, fabricating two gate-electrode layers on the substrate layer, each of the two gate-electrode layers facing one of the opposite side faces of the fin-shaped layer-section and filling the distance (d) between the fin-shaped layer section and the respective contact-post layer section, and, fabricating separate gate contacts, each connecting with one respective gate electrode layer;

wherein before patterning the active semiconductor layer a step of depositing a hard mask is performed, which hard-mask is stable against a first etching agent that attacks the gate-electrode layers;

wherein the depositing the hard mask comprises depositing a first hard-mask layer on the active semiconductor layer and a second hard-mask layer on the first hard-mask layer, wherein the first and second hard-mask layers are mutually stable against etching agents that attack the respective other hard-mask layer; and comprising the steps:

selectively removing the second hard mask layer from the source and drain layer sections after patterning the gate-electrode material layer;

selectively removing the first hard mask layer from the source and drain layer sections;

forming a metal silicide on a surface of the source, drain and gate-electrode layer sections of the active semiconductor layer, and on a surface of portions of the fin-shaped layer-section outside the channel regions;

removing the second and first hard-mask sections from the contact-post layer sections of the active semiconductor layer;

conformally depositing a dielectric layer;

fabricating openings in the dielectric layer that reach to the surface of the contact-post layer sections;

fabricating contacts in the openings, wherein the contacts abut the surface of the respective contact-post layer section and a side face of the respective gate-electrode layers.

10. The method of claim 9, wherein fabricating the gate-electrode layers comprises conformally depositing a contiguous gate-electrode-material layer on the patterned active semiconductor layer;

patterning the gate-electrode-material layer to cover only a strip extending in one lateral direction from the first contact-post layer section to the second contact-post layer section, and in a second lateral direction, which corresponds to the longitudinal direction of the fin-shaped layer section, over desired channel regions of the fin-shaped layer section between the source and drain layer sections, etching the gate-electrode material layer anisotropically until the reaching the second hard-mask layer, thus separating the gate-electrode material layer into the two gate-electrode layers.

11. The method of claim 9, comprising the steps removing the hard mask from the contact posts and from the source and drain layer sections after patterning the gate-electrode material layer;

fabricating a dielectric layer that covers the fin-shaped layer section;

selectively depositing semiconductor material on the contact posts and on the source and drain layer sections;

siliciding the semiconductor material.

* * * * *